(12) United States Patent
Chang

(10) Patent No.: US 11,665,916 B2
(45) Date of Patent: May 30, 2023

(54) MEMORY DEVICES AND METHODS FOR FORMING THE SAME

(71) Applicant: Winbond Electronics Corp., Taichung (TW)

(72) Inventor: Hao Chuan Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/788,691

(22) Filed: Feb. 12, 2020

(65) Prior Publication Data

US 2021/0249414 A1 Aug. 12, 2021

(51) Int. Cl.
| | | |
|---|---|---|
| H01L 21/768 | (2006.01) | |
| H01L 23/528 | (2006.01) | |
| H01L 23/532 | (2006.01) | |
| H01L 21/3213 | (2006.01) | |
| H01L 21/02 | (2006.01) | |
| H01L 29/423 | (2006.01) | |
| H01L 21/285 | (2006.01) | |

(52) U.S. Cl.
CPC ....... *H10B 99/00* (2023.02); *H01L 21/02233* (2013.01); *H01L 21/32133* (2013.01); *H01L 21/7682* (2013.01); *H01L 21/76843* (2013.01); *H01L 21/76877* (2013.01); *H01L 23/528* (2013.01); *H01L 23/53295* (2013.01); *H01L 29/4236* (2013.01); *H01L 21/28568* (2013.01)

(58) Field of Classification Search
CPC .......... H01L 27/1052; H01L 21/02233; H01L 21/76877; H01L 29/4236; H01L 21/76843; H01L 21/7682; H01L 23/528; H01L 23/53295; H01L 21/32133; H01L 21/28568; H01L 29/42376; H01L 2221/1042; H01L 21/764; H01L 29/0649
See application file for complete search history.

(56) References Cited

U.S. PATENT DOCUMENTS

| | | | |
|---|---|---|---|
| 8,119,527 B1 * | 2/2012 | Chadrashekar ... | H01L 21/67161 438/685 |
| 9,368,589 B2 * | 6/2016 | Baek ................ | H01L 27/10814 |
| 9,627,316 B1 * | 4/2017 | Chang ................ | H01L 23/5226 |

(Continued)

FOREIGN PATENT DOCUMENTS

| | | |
|---|---|---|
| CN | 105719998 A | 6/2016 |
| TW | I-662656 B | 6/2019 |

OTHER PUBLICATIONS

Office Action dated Sep. 8, 2020 in TW Application No. 108147779 (4 pages).

*Primary Examiner* — Bradley Smith
*Assistant Examiner* — William Henry Anderson
(74) *Attorney, Agent, or Firm* — Muncy, Geissler, Olds & Lowe, P.C.

(57) ABSTRACT

A memory device includes a substrate, a buried word line, a connecting structure, an air gap, and a first dielectric layer. The buried word line is disposed in the substrate. The connecting structure is disposed on the buried word line. The air gap is disposed on the buried word line and is adjacent to the connecting structure. The first dielectric layer is disposed on the connecting structure and the air gap, wherein the buried word line, the connecting structure, and the first dielectric layer are disposed in the first direction, which is substantially perpendicular to the top surface of the substrate.

20 Claims, 5 Drawing Sheets

(56) References Cited

U.S. PATENT DOCUMENTS

| | | | |
|---|---|---|---|
| 10,522,642 B2* | 12/2019 | Lee | H01L 29/4991 |
| 2013/0146958 A1 | 6/2013 | Kim et al. | |
| 2016/0322365 A1 | 11/2016 | Kim | |
| 2018/0145080 A1* | 5/2018 | Kim | H01L 29/66621 |
| 2019/0393335 A1* | 12/2019 | Economikos | H01L 29/4232 |
| 2021/0242211 A1* | 8/2021 | Huang | H01L 21/76843 |

* cited by examiner

MEMORY DEVICES AND METHODS FOR FORMING THE SAME

BACKGROUND

Technical Field

The present disclosure relates to semiconductor manufacturing, and in particular it relates to memory devices and methods for forming the same.

Description of the Related Art

With the trend of miniaturization of electronic products, the size of memory devices must also continue to shrink. In order to meet this requirement, a memory device with buried word lines has been developed to increase the integration and improve performance. However, continued miniaturization has increased the capacitive coupling between adjacent interconnect structures, metal lines, or other components, and has a negative impact on the performance of the memory device. Therefore, there is a need to improve the manufacturing method of the memory device to improve the performance of the memory device.

BRIEF SUMMARY

In accordance with some embodiments of the present disclosure, a memory device is provided. The memory device includes a buried word line disposed in a substrate; a connecting structure disposed on the buried word line; an air gap disposed on the buried word line and adjacent to the connecting structure; and a first dielectric layer disposed on the connecting structure and the air gap, wherein the buried word line, the connecting structure, and the first dielectric layer are disposed in the first direction, which is substantially perpendicular to the top surface of the substrate.

In accordance with some embodiments of the present disclosure, a method of forming memory devices is provided. The method includes forming a buried word line in a substrate; forming a sacrificial structure on the buried word line, wherein the sacrificial structure covers both sides of the buried word line and exposes a portion of the buried word line; forming a connecting structure on the portion of the buried word line; removing the sacrificial structure after forming the connecting structure; and forming a first dielectric layer on the connecting structure such that an air gap is formed between the first dielectric layer and the buried word line.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following describes memory devices and methods for forming the same in accordance with some embodiments of the present disclosure, and is particularly suitable for a memory device having buried word lines. The present disclosure provides an air gap on the buried word line to replace a portion of the dielectric layer to reduce the overall dielectric constant and improve problems such as capacitive coupling, thereby improving the performance of the memory device.

Figure 1A:
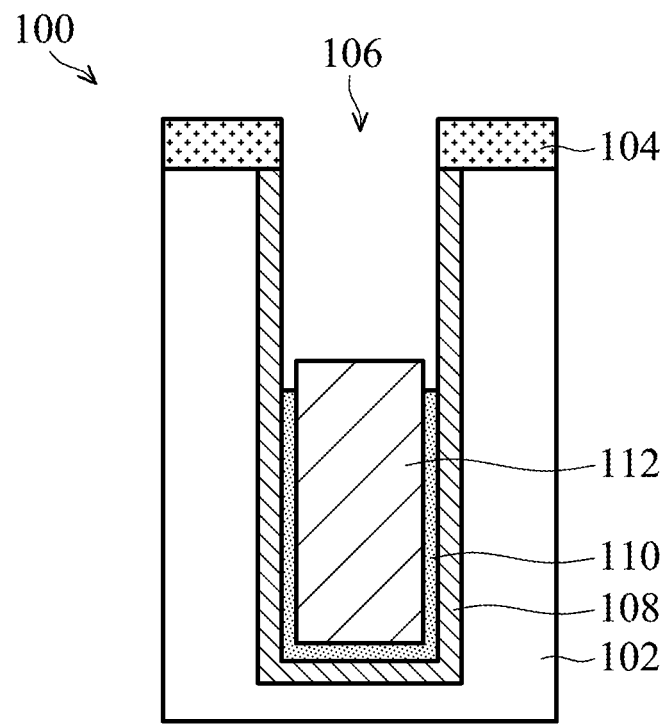
FIGS. 1A-1B are cross-sectional views illustrating various stages of manufacturing a memory device in accordance with some embodiments.

FIG. 1A is a cross-sectional view of a memory device 100 in accordance with some embodiments. As illustrated in FIG. 1A, the memory device 100 includes a substrate 102. The substrate 102 is, for example, a silicon wafer. Any desired semiconductor element may be formed in and on the substrate 102. However, in order to simplify the figures, only the flat substrate 102 is illustrated. In the description of the present disclosure, the term "substrate" may include components formed on a semiconductor wafer and various coatings covering the semiconductor wafer.

Next, a mask layer 104 is disposed on the substrate 102, and then an etching process is performed using the mask layer 104 as an etching mask to etch a trench 106 in the substrate 102. The mask layer 104 may include a hard mask, and is formed of, for example, silicon oxide or the like. The mask layer 104 may be formed by a deposition process or another suitable process.

Then, a dielectric layer 108 is formed in the trench 106. In some embodiments, the dielectric layer 108 may be formed by oxidizing a portion of the substrate 102. In other embodiments, the dielectric layer 108 may be formed by depositing a dielectric material in the trench 106 by a deposition process. The dielectric material may include silicon oxide, silicon nitride, silicon oxynitride, the like, or a combination thereof.

Then, according to some embodiments, a liner 110 is formed in the trench 106. In some embodiments, the liner 110 may include titanium, titanium nitride, or the like. The liner 110 may be formed by, for example, an atomic layer deposition (ALD) process or the like.

Then, according to some embodiments, a buried word line 112 is formed in a lower portion of the trench 106. The liner 110 is located between the buried word line 112 and the dielectric layer 108. The buried word line 112 may be formed by forming a conductive material in the trench 106 through a deposition process. According to some embodiments, the conductive material includes doped or undoped polycrystalline silicon, metal, the like, or a combination thereof. According to some embodiments, the deposition process includes a physical vapor deposition (PVD) process, a chemical vapor deposition (CVD) process, an ALD process, or the like.

Figure 1B:
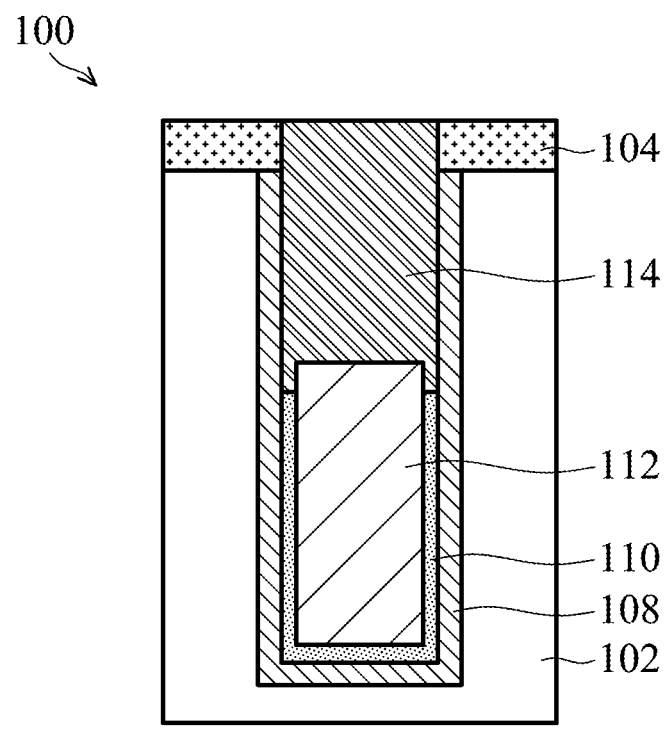

Then, according to some embodiments, as illustrated in FIG. 1B, a dielectric layer 114 is formed on in remaining portion of the trench 106. According to some embodiments, the dielectric layer 114 may be formed by forming a dielectric material through a deposition process. The examples of the dielectric material and the deposition process are as described above, so they will not be described again. However, the formation of the dielectric layer 114 may easily cause the capacitive coupling of the memory device 100. Therefore, the present disclosure provides another embodiment to solve the above problem.

Figure 2A:
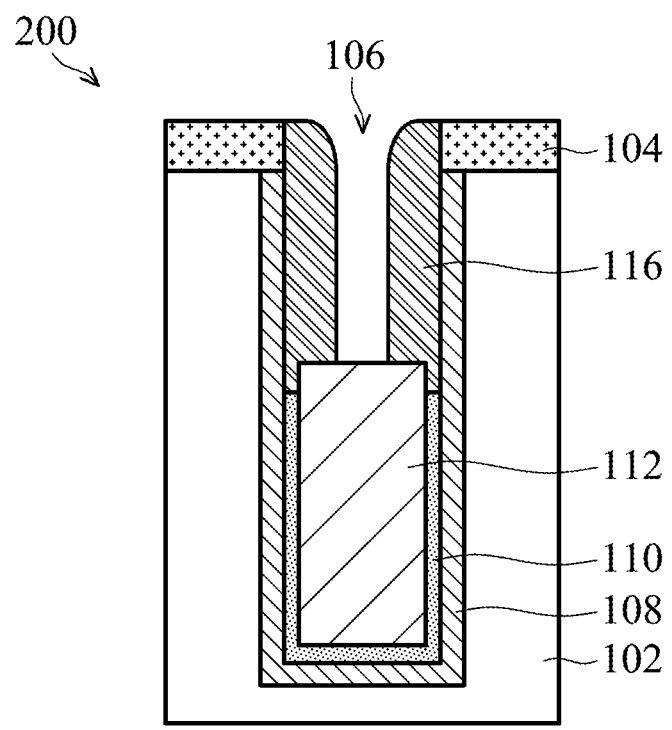
FIGS. 2A-2G are cross-sectional views illustrating various stages of manufacturing a memory device in accordance with some embodiments.

FIG. 2A is a process step following FIG. 1A. For simplicity, the same elements will be described below with the same symbols. The formation methods and materials of these elements are as described above, and will not be repeated again.

Compared to the embodiments where the dielectric layer 114 is formed directly on the buried word line 112 as illustrated in FIG. 1B, the following embodiments will replace a portion of the dielectric layer 114 with an air gap to reduce the overall dielectric constant, and improve capacitive coupling.

In some embodiments, as illustrated in FIG. 2A, the buried word line 112 is formed in the lower portion of the trench 106, and then a sacrificial structure 116 is conformally formed in an upper portion of the trench 106. According to some embodiments, the sacrificial structure 116 may be formed by forming a material of the sacrificial structure 116 through a deposition process. For example, the material of the sacrificial structure 116 may include a dielectric material, such as silicon oxide, silicon nitride, silicon oxynitride, silicon carbide, silicon carbonitride, the like, or a combination thereof. The example of the deposition process is as described above, and will not be repeated again.

Then, according to some embodiments, a portion of the material of the sacrificial structure 116 is removed to expose a portion of the buried word line 112. The remaining portion of the sacrificial structure 116 is the position where the subsequent formed air gap (as illustrated in FIG. 2F) is placed. Therefore, the size and/or position of the air gap can be adjusted by adjusting the size and/or position of the remaining portion of the sacrificial structure 116. The portion of the sacrificial structure 116 may be removed by an etching process, and the example of the etching process is as described above, and will not be repeated again.

As illustrated in FIG. 2A, the sacrificial structure 116 covers both sidewalls of the trench 106 and both sides of the buried word line 112, and only the middle portion of the buried word line 112 is exposed to form an air gap on both sides of the trench 106.

Figure 2B:
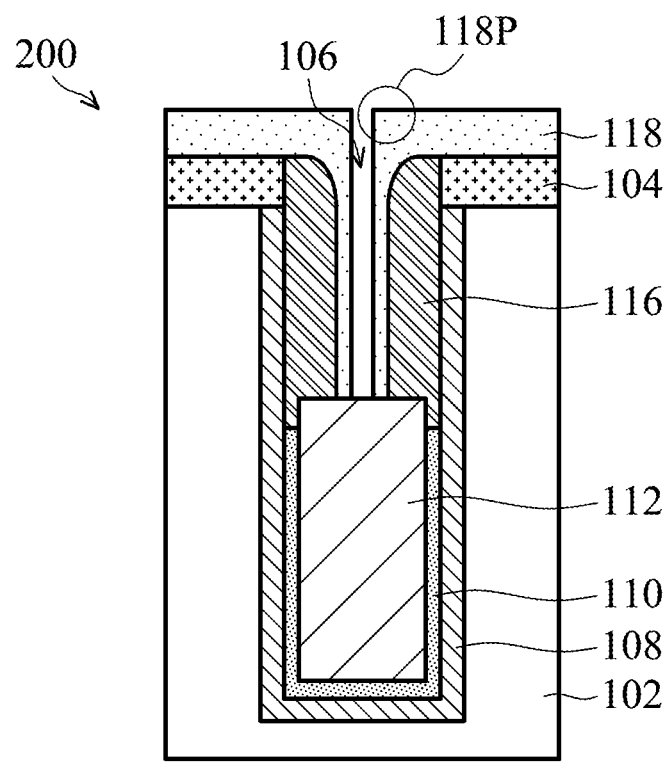

Then, according to some embodiments, as illustrated in FIG. 2B, a material layer 118 is formed on the sacrificial structure 116 and the mask layer 104. According to some embodiments, the material layer 118 includes a conductive material. For example, the conductive material includes doped or undoped polycrystalline silicon, a metal, the like, or a combination thereof. For example, the metal includes gold, nickel, platinum, palladium, iridium, titanium, chromium, tungsten, aluminum, copper, the like, an alloy thereof, a multilayer thereof, or a combination thereof. The conductive material may be formed by a deposition process, such as a PVD process, a CVD process, an ALD process, an evaporation process, an electroplating process, the like, or a combination thereof.

In this embodiment, the material layer 118 includes a conductive material to improve the problem of resistance-capacitance (RC) delay, but the present disclosure is not limited thereto. In other embodiments, the material layer 118 may include other materials, such as a dielectric material. The material of the sacrificial structure 116 and the material of the material layer 118 may be selected to have different etch selectivity, so that the subsequent process of removing the sacrificial structure 116 is not likely to damage the material layer 118 to avoid defects in the memory device 200. For example, the sacrificial structure 116 includes silicon nitride and the material layer 118 includes polycrystalline silicon.

Figure 2C:
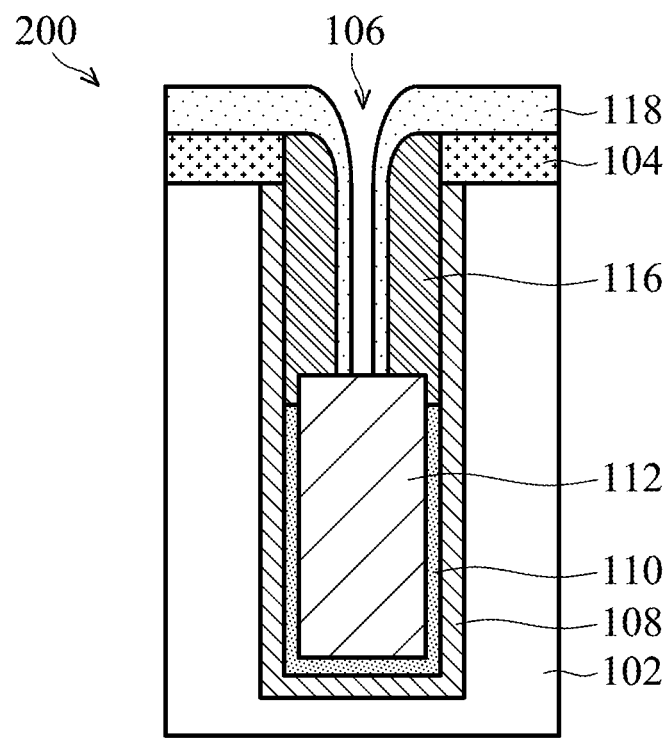

With continued reference to FIG. 2B, during the deposition of the material layer 118, a protrusion 118P may be formed. In some cases, the protrusion 118P of the material layer 118 may block the remaining material layer 118 from being formed in the trench 106, so that the inside of the material layer 118 has pores. Therefore, according to some embodiments, as illustrated in FIG. 2C, an etching process is performed to remove the protrusion 118P of the material layer 118. The example of the etching process is as described above, and will not be repeated again.

Figure 2D:
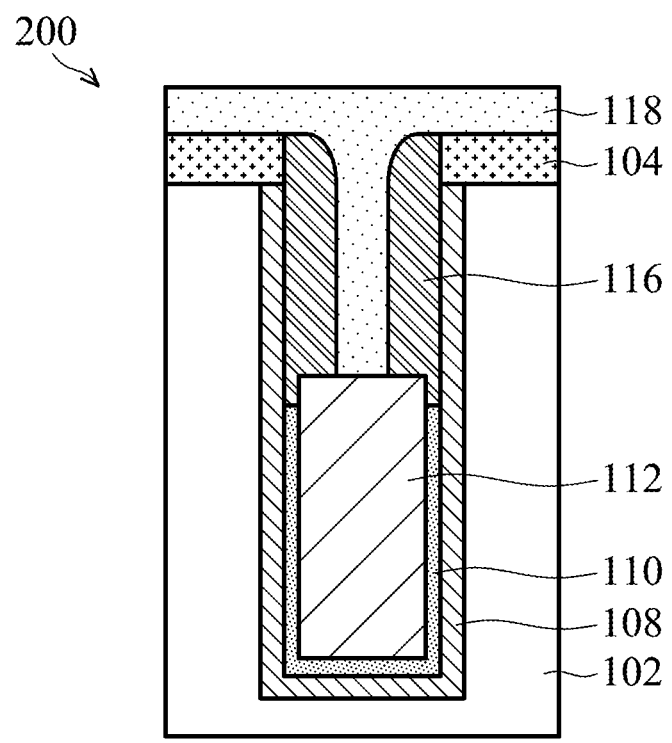

Then, according to some embodiments, as illustrated in FIG. 2D, the material layer 118 is continuously deposited on the etched material layer 118 to cover the exposed portion of the buried word line 112. Depending on the aspect ratio of the trench 106, the cycles of above-mentioned etching and deposition may be repeated multiple times. In this way, the size and/or position of the connecting structure 118' (as illustrated in FIG. 2E) formed by the material layer 118 can be adjusted without limited by the aspect ratio of the trench 106.

The above-mentioned etching process is merely optional. In other embodiments, after the step illustrated in FIG. 2B, the etching process as illustrated in FIG. 2C may not be performed, but the material layer 118 may be continuously deposited to cover the exposed portion of the buried word line 112, as illustrated in FIG. 2D.

Figure 2E:
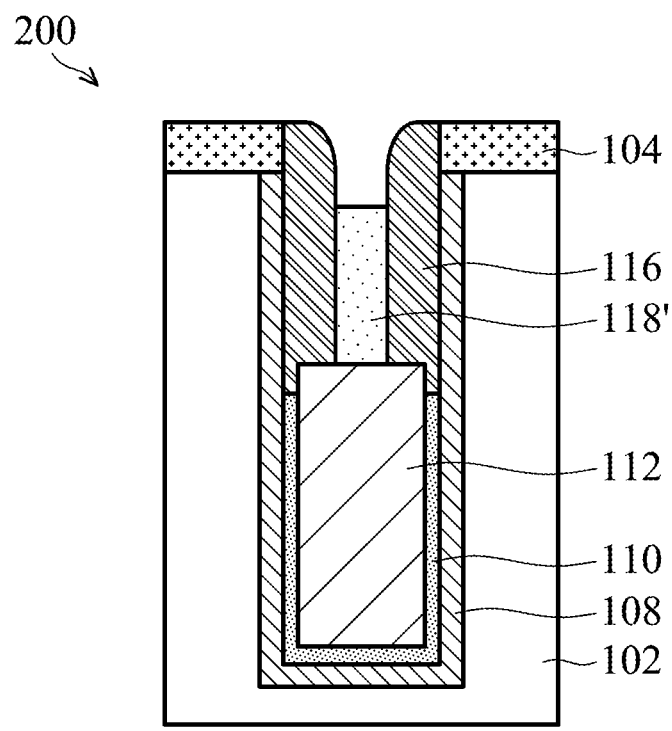
Figure 2F:
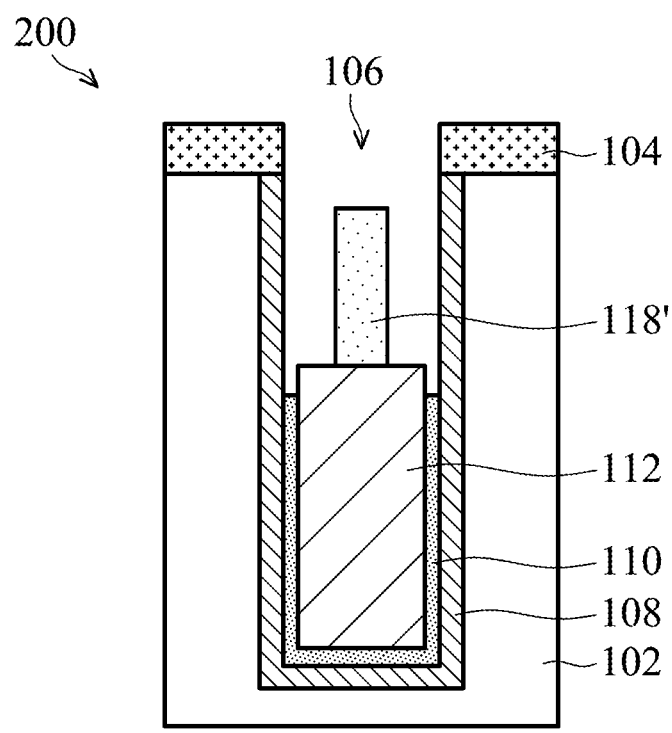

Then, according to some embodiments, as illustrated in FIG. 2E, an etching process is performed to remove an upper portion of the material layer 118, and a connecting structure 118' is formed to electrically connect the buried word line 112 and other elements. The example of the etching process is as described above, and will not be repeated again. Since the sacrificial structure 116 covers a portion of the top surface of the buried word line 112 the bottom surface of the connecting structure 118' is smaller than the top surface of the buried word line 112, as illustrated in FIG. 2E.

As illustrated in FIG. 2E, the top surface of the connecting structure 118' is lower than the top surface of the dielectric layer 108. According to some embodiments, since the connecting structure 118' includes a conductive material, reducing a height of the top surface of the connecting structure 118' can keep the connecting structure 118' away from the subsequently formed elements (such as contacts), avoiding short circuits between the connecting structure 118' and the elements, thereby improving the reliability of the memory device 200. As previously discussed, multiple cycles of etching and deposition can be performed to adjust the height of the top surface of the connecting structure 118'.

Then, according to some embodiments, as illustrated in FIG. 2F, an etching process is performed to remove the sacrificial structure 116, and the sidewall of the trench 106 is exposed again. The example of the etching process is as described above, and will not be repeated again.

Figure 2G:
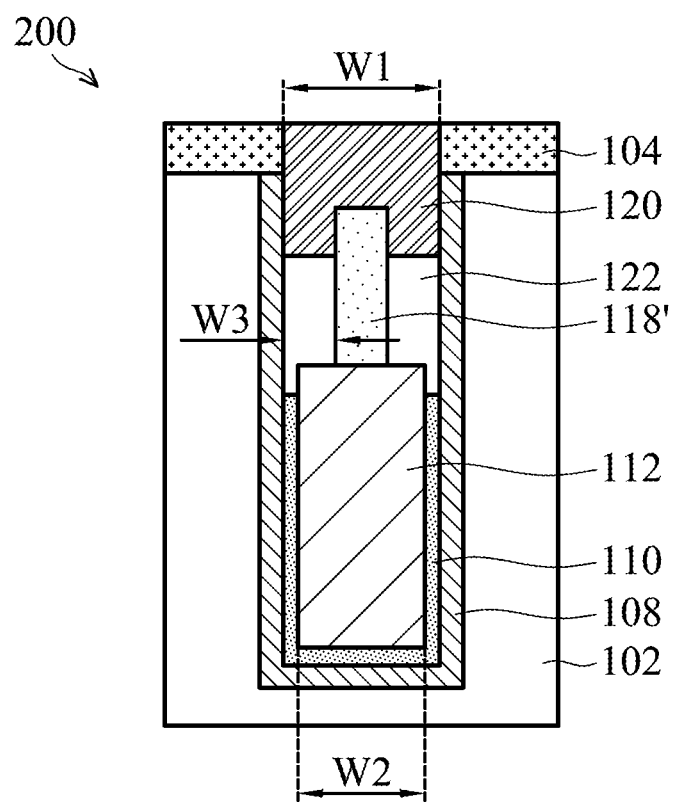

Then, according to some embodiments, as illustrated in FIG. 2G, a dielectric layer 120 is formed in the trench 106 to cover the top portion of the connecting structure 118'. The buried word line 112, the connecting structure 118', and the dielectric layer 120 are disposed in a direction that is substantially perpendicular to the top surface of the substrate 102. The dielectric layer 120 may be formed by forming a dielectric material in the trench 106 through a deposition process, and performing a planarization process such as a chemical mechanical polishing process to remove an excess portion of the dielectric material. Since the connecting structure 118' on the buried word line 112 increases the aspect ratio of the upper portion of the trench 106, the material of the dielectric layer 120 does not easily enter the space between the connecting structure 118' and the substrate 102, thus an air gap 122 can be formed.

Compared to the embodiment where the dielectric layer 114 is formed directly on the buried word line 112 as illustrated in the FIG. 1B, in the embodiment of FIG. 2G, forming the air gap 122 and the connecting structure 118' first, and then forming the dielectric layer 120 can reduce the overall dielectric constant value on the buried word line 112, improve the problem of capacitive coupling, thereby improving the performance of the memory device 200. In addition, the connecting structure 118' including a conductive material can solve the problem of RC delay and further improve the performance of the memory device 200.

As described above, since the sacrificial structure 116 is located on both sides of the connecting structure 118', the air gap 122 is formed at the position of the sacrificial structure 116 also adjacent to both sides of the connecting structure 118'.

The connecting structure 118' is in direct contact with the buried word line 112 and the dielectric layer 120. As illustrated in FIG. 2G, the dielectric layer 120 covers a portion of the sidewall and the top surface of the connecting structure 118', and extends below the top surface of the dielectric layer 108. The width W1 of the dielectric layer 120 is larger than the width W2 of the buried word line 112, and the width W2 of the buried word line 112 is larger than the width W3 of the air gap 122.

Since the top surface of the liner 110 is lower than the top surface of the buried word line 112, a portion of the air gap 122 is located between the sidewall of the buried word line 112 and the substrate 102. As illustrated in FIG. 2G, the liner 110 and the dielectric layer 120 are separated by the air gap 122, and the buried word line 112 and the dielectric layer 120 are separated by the air gap 122.

In summary, the memory device provided by the present disclosure can reduce the overall dielectric constant, reduce the capacitive coupling, and improve the performance of the memory device by replacing a portion of a dielectric material with an air gap and a connecting structure.

In addition, in some embodiments, the connecting structure includes a conductive material to reduce the resistance value, reduce the RC delay, and further improve the performance of the memory device. Further, in some embodiments, cycles of etching and deposition may be repeated to reduce the height of the top surface of the connecting structure to avoid short circuits between the subsequently formed elements and the connecting structure, thereby improving the reliability of the memory device.

Although the present disclosure has been described above by various embodiments, these embodiments are not intended to limit the disclosure. Those skilled in the art should appreciate that they may make various changes, substitutions and alterations without departing from the spirit and scope of the disclosure. Therefore, the scope of protection of the present disclosure is defined as the subject matter set forth in the appended claims.

What is claimed is:

1. A memory device, comprising:
   a buried word line comprising a metal disposed in a substrate;
   a connecting structure comprising a polycrystalline disposed on the buried word line;
   an air gap disposed on the buried word line and adjacent to the connecting structure; and
   a first dielectric layer disposed on the connecting structure and the air gap, wherein the buried word line, the connecting structure, and the first dielectric layer are disposed in a first direction, which is substantially perpendicular to a top surface of the substrate;
   wherein a material of the buried word line is different from a material of the connecting structure, the first dielectric layer covers a portion of a sidewall of the connecting structure and a top surface of the connecting structure, a first portion of the air gap contacts another portion of the sidewall of the connecting structure and a portion of a top surface of the buried word line, and a second portion of the air gap contacts a portion of a sidewall of the buried word line.

2. The memory device as claimed in claim 1, wherein the connecting structure comprises a conductive material.

3. The memory device as claimed in claim 1, wherein a bottom surface of the connecting structure is smaller than the top surface of the buried word line.

4. The memory device as claimed in claim 1, wherein the first portion of the air gap is on both sides of the connecting structure.

5. The memory device as claimed in claim 1, wherein the second portion of the air gap is between the sidewall of the buried word line and the substrate.

6. The memory device as claimed in claim 1, wherein a width of the first dielectric layer is greater than a width of the buried word line.

7. The memory device as claimed in claim 1, wherein the connecting structure is in direct contact with the buried word line and the first dielectric layer.

8. The memory device as claimed in claim 1, wherein the buried word line, the connecting structure and the air gap are disposed in a trench, and wherein the memory device further comprises a second dielectric layer disposed on a sidewall of the trench.

9. The memory device as claimed in claim 8, further comprising a liner disposed between the second dielectric layer and the buried word line.

10. The memory device as claimed in claim 9, wherein the liner and the first dielectric layer are separated by the air gap.

11. A method of forming memory devices, comprising:
    forming a buried word line comprising a metal in a substrate;
    forming a sacrificial structure on the buried word line, wherein the sacrificial structure covers both sides of the buried word line and exposes a portion of the buried word line;
    forming a connecting structure comprising a polycrystalline on the portion of the buried word line;
    removing the sacrificial structure after forming the connecting structure; and
    forming a first dielectric layer on the connecting structure and covering a portion of a sidewall of the connecting structure and a top surface of the connecting structure, so that an air gap is formed between the first dielectric layer and the buried word line, wherein a material of the buried word line is different from a material of the connecting structure, a first portion of the air gap contacts another portion of the sidewall of the connecting structure and a portion of a top surface of the buried word line, and a second portion of the air gap contacts a portion of a sidewall of the buried word line.

12. The method as claimed in claim 11, wherein forming the connecting structure comprises:
    conformally forming a first material layer on the sacrificial structure;
    etching a protrusion of the first material layer;
    forming a second material layer on the etched first material layer to cover the portion of the buried word line; and
    removing upper portions of the first material layer and the second material layer to form the connecting structure.

13. The method as claimed in claim 12, wherein the first material layer and the second material layer comprise the same conductive material.

14. The method as claimed in claim 11, wherein the first portion of the air gap is adjacent to both sides of the connecting structure.

15. The method as claimed in claim 11, wherein the first dielectric layer covers a top portion of the connecting structure.

16. The method as claimed in claim 11, wherein the sacrificial structure comprises a dielectric material.

17. The method as claimed in claim 11, further comprising:
   forming a trench in the substrate before forming the buried word line;
   forming the buried word line in a lower portion of the trench; and
   conformally forming the sacrificial structure on an upper portion of the trench to cover both sides of the trench.

18. The method as claimed in claim 17, further comprising conformally forming a liner in the trench before forming the buried word line, wherein a top surface of the liner is lower than the top surface of the buried word line.

19. The method as claimed in claim 18, further comprising forming a second dielectric layer in the trench before forming the liner, wherein a top surface of the second dielectric layer is higher than the top surface of the connecting structure.

20. The method as claimed in claim 19, wherein forming the second dielectric layer comprises oxidizing a portion of the substrate.

\* \* \* \* \*